United States Patent
Chen et al.

(10) Patent No.: US 8,707,001 B2
(45) Date of Patent: Apr. 22, 2014

(54) METHOD AND SYSTEM FOR MEASURING MEMORY ACCESS TIME USING PHASE DETECTOR

(75) Inventors: Nan Chen, San Diego, CA (US); Zhiqin Chen, San Diego, CA (US); Varun Verma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 522 days.

(21) Appl. No.: 12/328,283

(22) Filed: Dec. 4, 2008

(65) Prior Publication Data

US 2010/0146320 A1    Jun. 10, 2010

(51) Int. Cl.
*G06F 12/00* (2006.01)

(52) U.S. Cl.
USPC ........... 711/167; 713/400; 713/401; 713/500; 713/503; 327/144; 327/153; 327/161; 327/261; 327/291; 375/371

(58) Field of Classification Search
USPC .................. 711/167; 713/400, 401, 500, 503; 327/144, 153, 161, 261, 291; 375/371
See application file for complete search history.

(56) References Cited

U.S. PATENT DOCUMENTS

| | | | |
|---|---|---|---|
| 5,675,265 A * | 10/1997 | Yamamori | 327/3 |
| 6,266,749 B1 | 7/2001 | Hashimoto et al. | |
| 6,327,218 B1 | 12/2001 | Bosshart | |
| 6,424,583 B1 | 7/2002 | Sung et al. | |
| 6,553,505 B1 * | 4/2003 | Brown et al. | 713/401 |
| 6,647,538 B1 * | 11/2003 | Brown | 716/108 |
| 6,873,557 B2 | 3/2005 | Chang et al. | |
| 7,138,829 B1 * | 11/2006 | Dalvi | 326/41 |
| 2002/0010559 A1 * | 1/2002 | Matsui | 702/117 |
| 2003/0208717 A1 * | 11/2003 | Klotchkov et al. | 714/814 |

OTHER PUBLICATIONS

International Search Report and Written Opinion—PCT/US2009/066487—ISA/EPO—Feb. 25, 2010.
Taiwan Search Report—TW098141547—TIPO—Jul. 29, 2013.

* cited by examiner

*Primary Examiner* — Arpan P. Savla
(74) *Attorney, Agent, or Firm* — Sam Talpalatsky; Nicholas J. Pauley; Joseph Agusta

(57) ABSTRACT

Methods and systems for determining a memory access time are provided. A first phase skew is measured between a first clock signal used by a memory and a second clock signal used as a reference clock signal. Then, a second phase skew is measured between a delayed version of the first clock signal output by the memory when the memory completes a given read operation and the second clock signal. The memory access time is determined based on the first and second phase skews.

22 Claims, 8 Drawing Sheets

METHOD AND SYSTEM FOR MEASURING MEMORY ACCESS TIME USING PHASE DETECTOR

FIELD OF DISCLOSURE

The invention relates to a system and method of determining memory access time of a memory.

BACKGROUND

In computing systems, memory latency or memory access time is the time between initiating a request for data until the requested data is retrieved from a memory. Memory can be tested to determine its memory access time. For example, the memory access time for a given memory indicates how fast that memory can provide data, which can allow more aggressive timings in the computing system. Also, the memory can be tested by comparing the determined memory access time with a threshold memory access time to determine whether the given memory "passes" or "fails". As will be appreciated, if timings in the computing system are set too aggressively (e.g., due to an incorrect estimation of the memory's memory access time), memory errors can occur because the memory may not be capable of providing data fast enough for other system elements.

FIG. 1 illustrates a conventional memory test configuration for testing a memory access time of a memory. As shown in FIG. 1, the conventional memory test configuration includes an input register (IREG), a memory 105 (e.g., a random access memory (RAM), a read-only memory (ROM), etc.) and an output register (OREG) 110. While illustrated as separate elements, the IREQ 100, memory 105 and OREG 110 may collectively comprise a memory module that may be encapsulated within a wrapper.

Referring to FIG. 1, the IREG 100, memory 105 and OREG 110 are each connected to an input bus. As shown, the IREG 100 receives memory command information (e.g., an address location Addr, information for a write command, information for a read command, etc.) from the input bus. The IREG receives an input register clock signal ICLK, the memory 105 receives a memory clock signal MCLK and the OREG 110 receives the output register clock signal OCLK.

In an example, assume the memory command information on the input bus corresponds to a write command. The IREG 100 latches the write command information (e.g., write address, etc.) at a rising edge of ICLK after a setup time of the IREG 100. This information reaches input register output after a clock to queue delay.

Next, after a setup time of the memory 105, a rising edge of MLCK initiates the write command at the memory 105 based on the latched write command information from the IREG 100. Likewise, if the memory command information on the input bus corresponds to a read command, the IREG 100 latches the read command information at a rising edge of ICLK after a setup time of the IREG 100. Then, after a setup time of the memory 105, a rising edge of MLCK initiates the read command at the memory 105 based on the latched read command information from the IREG 100.

As will be appreciated, for a read operation, the timing of OCLK is configured such that a rising edge of OCLK corresponds to a time as close as possible after the memory 105 completes the read operation. In other words, OCLK should be more or less offset from MCLK by the memory access time. Accordingly, the OREG 110 latches the read data at a rising edge of OCLK after a setup time of the OREG 110. The latched read data can be read out through an output bus to output pins, as shown in FIG. 1. As will be appreciated, if OCLK is offset from MLCK less than the memory access time, incorrect data will be latched by the OREG 110.

Conventionally, in order to determine the memory access time for the memory 105, OCLK is initially offset from MCLK by a relatively high amount. Next, OCLK is adjusted and is moved closer to MCLK, in increments, until memory errors begin occurring. The occurrence of memory errors in this case are indicative of the OREG 110 latching incorrect data due to OCLK being too close to MCLK because the offset between OCLK and MCLK is less than the memory access time of the memory 105. Based on this process, the memory access time can be determined as follows:

$$t_{ACCESS\_MEM} = t_{pad\_MCLK\_OCLK(min)} + t_{MCLK\_OCLK\_skew} - t_{WIRE\_delay} - t_{SETUP\_OREG} \quad (1)$$

wherein $t_{ACCESS\_MEM}$ denotes the calculated memory access time of the memory 105, $t_{pad\_MCLK\_OCLK(min)}$ denotes a measured minimum offset between MCLK and OCLK at which memory errors do not occur, $t_{MCLK\_OCLK\_skew}$ denotes a simulated skew between MCLK and OCLK, $t_{WIRE\_delay}$ denotes a simulated wire propagation delay, $t_{SETUP\_OREG}$ denotes a simulated setup time of the OREG 110.

In Equation 1, the simulated parameters $t_{WIRE\_delay}$, $t_{SETUP\_OREG}$ and $t_{MCLK\_OCLK\_skew}$ generally occur due to either parasitic extraction or a timing closure tool (e.g., PRIMETIME) result. The simulated parameters $t_{WIRE\_delay}$, $t_{SETUP\_OREG}$ and $t_{MCLK\_OCLK\_skew}$ reduce the precision of the determination of the memory access time $t_{ACCESS\_MEM}$.

SUMMARY

An embodiment of the invention is directed to a method of determining memory access time of a memory, including measuring a first phase skew between a first clock signal used by the memory and a second clock signal used as a reference clock signal, measuring a second phase skew between a delayed version of the first clock signal output by the memory when the memory completes a given read operation and the second clock signal and determining a memory access time of the memory based on the first and second phase skews.

Another embodiment of the invention is directed to a system configured to determine a memory access time of a memory, including means for measuring a first phase skew between a first clock signal used by the memory and a second clock signal used as a reference clock signal, means for measuring a second phase skew between a delayed version of the first clock signal output by the memory when the memory completes a given read operation and the second clock signal and means for determining a memory access time of the memory based on the first and second phase skews.

Another embodiment of the invention is directed to a system configured to determine a memory access time of a memory, including a first phase detector having first and second inputs, the first input connected to a memory clock signal over a first wired path having a first wire delay and the second input connected to a reference clock signal over a second wired path having a second wire delay, a second phase detector having third and fourth inputs, the third input connected to the memory clock signal over a third wired path having a third wire delay and the fourth input connected to the reference clock signal over a fourth wired path having a fourth wired delay, the third wired path including a memory portion that delays the third wired delay, a first sampler configured to measure a first phase skew between the memory clock signal over the first wired path and the reference clock signal over the second wired path by indicating when the first and second inputs of the first phase detector are synchronized, a second sampler configured to measure a second phase skew between the memory clock signal over the third wired path and the reference clock signal over the fourth wired path by indicating when the third and fourth inputs of the second phase detector are synchronized and a processing device configured to determine a memory access time of the memory based on the first and second phase skews.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
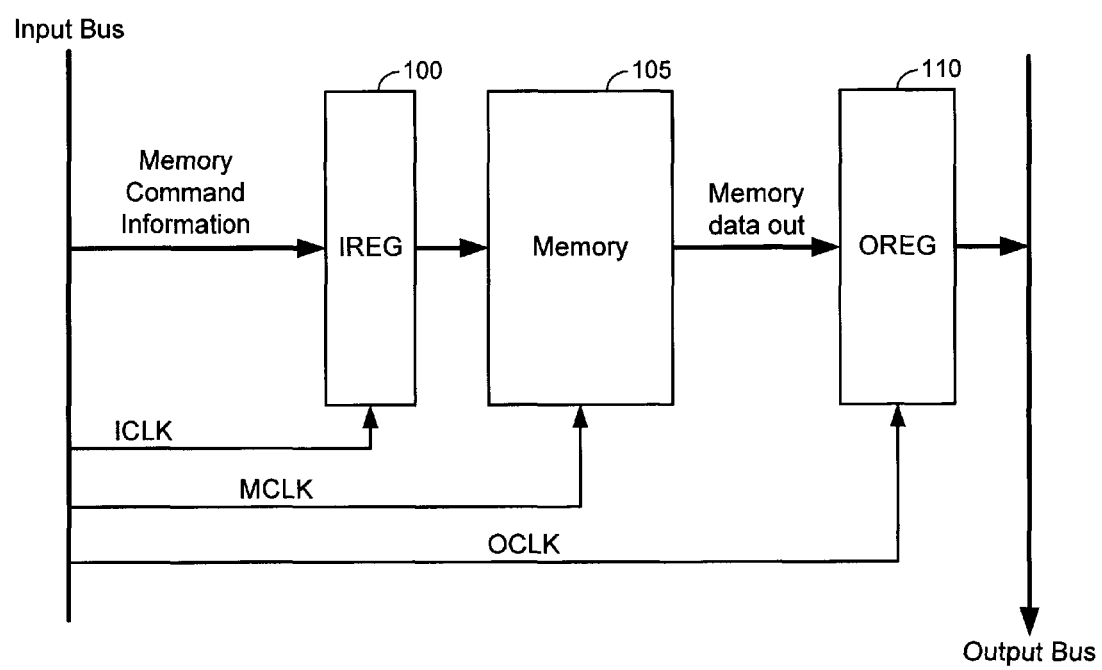
FIG. 1 illustrates a conventional memory test configuration for testing a memory access time of a memory.

Embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various embodiments of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Embodiments of the invention are generally directed to determining memory access time of a given memory using one or more phase detectors. Accordingly, an example structure and operation of a phase detector is described below with respect to FIGS. 2 through 5, followed by a description of embodiments of the invention that deploy the phase detector in a manner so as to accurately determine memory access time.

Figure 2:
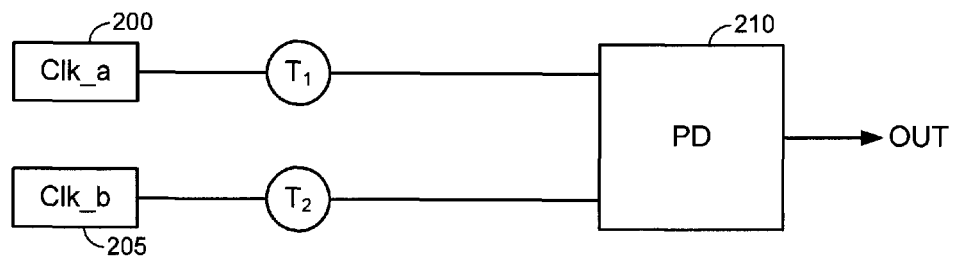
FIG. 2 illustrates a phase detector configuration.

FIG. 2 illustrates a phase detector configuration. Referring to FIG. 2, the phase detector configuration includes first and second clock generators 200 and 205 generating clock signals Clk_a and Clk_b, respectively. The clock signals Clk_a and Clk_b are provided to a phase detector 210. Between the clock generators 200 and 205 and the phase detector 210, the clock signals Clk_a and Clk_b are delayed by wire delays $T_1$ and $T_2$, respectively. The phase detector 210 outputs an output signal OUT that indicates a phase difference between Clk_a and Clk_b, as will be described in greater detail below.

Figure 3:
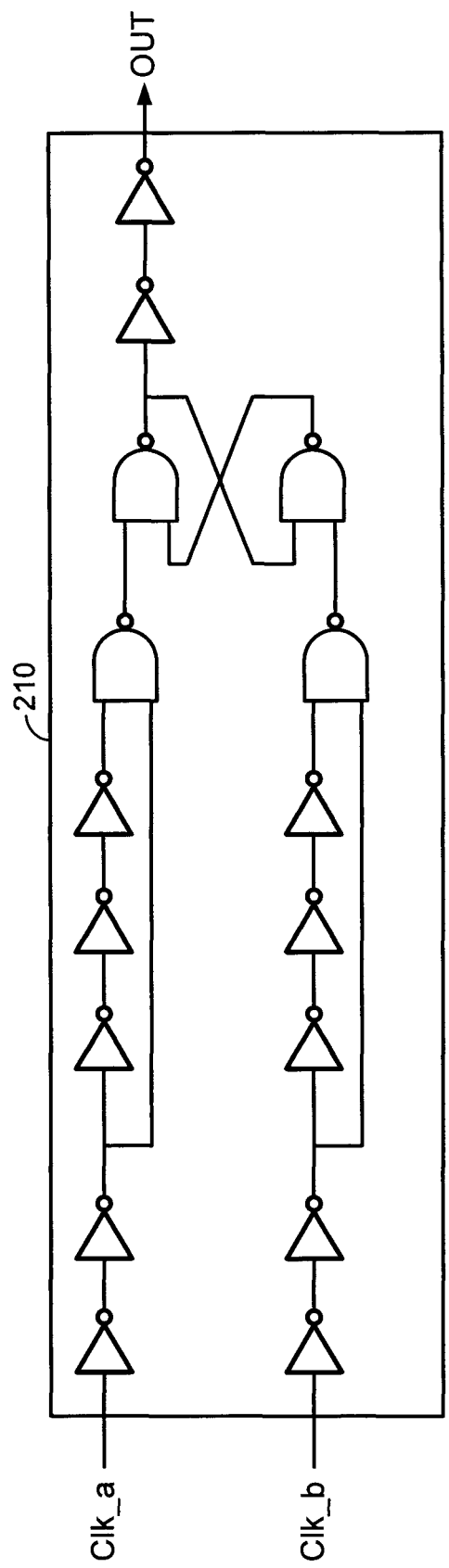
FIG. 3 illustrates the phase detector.

FIG. 3 illustrates the phase detector 210 according to an embodiment of the invention. In the example of FIG. 3, the phase detector 210 includes a plurality of inverters and NAND gates. The phase detector 210 receives two clock signals Clk_a and Clk_b and provides an output (OUT). If the rising edge of Clk_a lags a rising edge of Clk_b, a first logic level is output. Alternatively, if the rising edge of Clk_b lags a rising edge of Clk_a, a second logic level is output. The structure of FIG. 3 and the function of the internal inverters and logic gates will be readily appreciated by one of ordinary skill in the art and will not be discussed further in detail for the sake of brevity. Further, while FIG. 3 illustrates one possible phase detector implementation, it will be appreciated that many different phase detector configurations are possible, and any type of well-known phase detector may be deployed in other embodiments of the invention.

Figure 4:
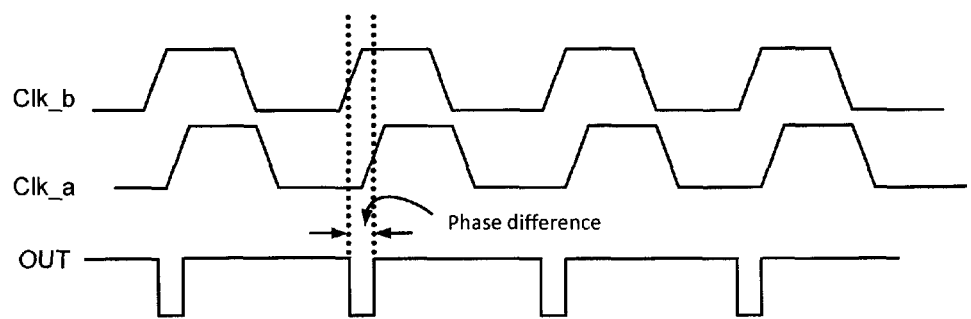
FIGS. 4 and 5 illustrate waveform diagrams of signals at the phase detector 210.
Figure 5:
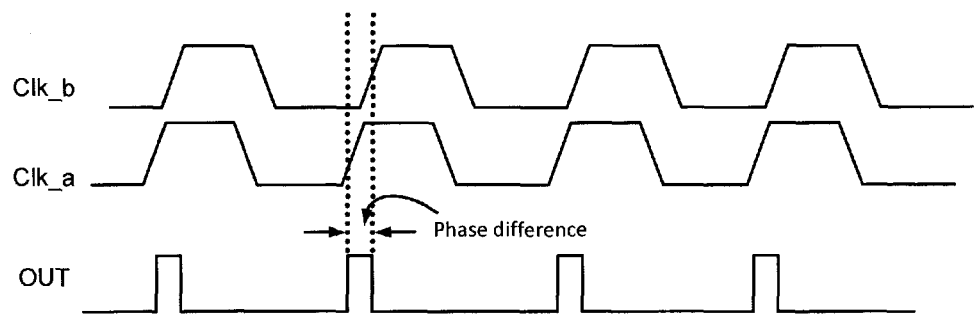

FIGS. 4 and 5 illustrate waveform diagrams of signals at the phase detector 210 according to an embodiment of the invention. In particular, FIG. 4 illustrates an embodiment where a rising edge of Clk_a lags a rising edge of Clk_b, and FIG. 5 illustrates an embodiment where a rising edge of Clk_a is ahead of a rising edge of Clk_b. Generally, as discussed above, with reference to the phase detector 210, if a rising edge of Clk_a is behind a rising edge of Clk_b, OUT will settle at a first logic level (e.g., a higher logic level or logic "1"). If a rising edge of Clk_a is ahead of a rising edge of Clk_b, OUT will settle at a second logic level (e.g., a lower logic level or logic "0"). Accordingly, signal OUT can be used to indicate a phase difference between the input clock signals.

In an example synchronization process, the phase detector 210 can initially set a rising edge of Clk_a behind that of a rising edge of Clk_b, and may slowly adjust the rising edge of Clk_a towards the rising edge of Clk_b. The output signal OUT can be sampled at a falling edge of Clk_b. When the sampling detects that the output signal OUT has switched from the first logic level to the second logic level, Clk_a and Clk_b rising edges are synchronized. As will be described below in greater detail, the synchronization process described above can be used in measurement process(es) to determine a memory access time of a memory.

Figure 6:
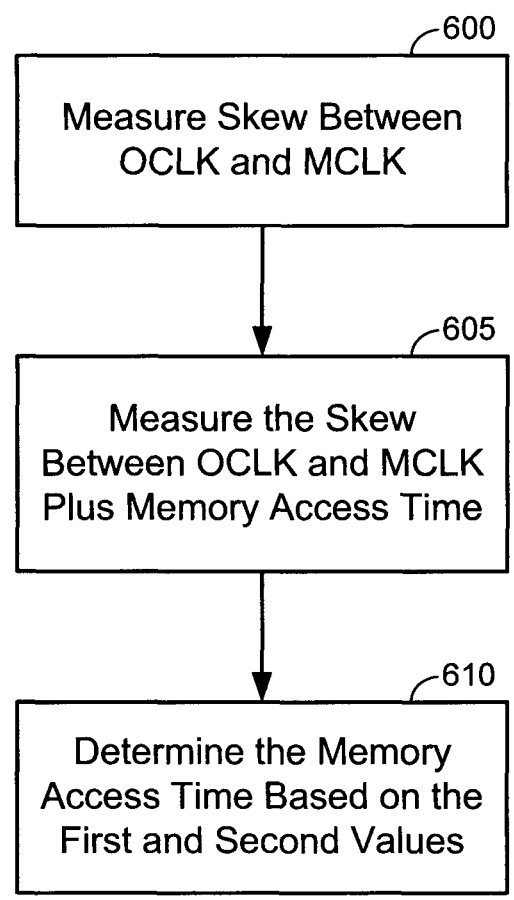
FIG. 6 illustrates a process for determining memory access time.

FIG. 6 illustrates a process for determining memory access time according to an embodiment of the invention. Below, the process of FIG. 6 is described as performed on the memory test configuration of FIG. 1, which includes an input register (IREG) 100, a memory 105 and an output register (OREG) 110, as described in greater detail within the Background section above. However, it will be appreciated that the process of FIG. 6 may be alternatively applied to any type of memory configuration in other embodiments of the invention.

Figure 7:
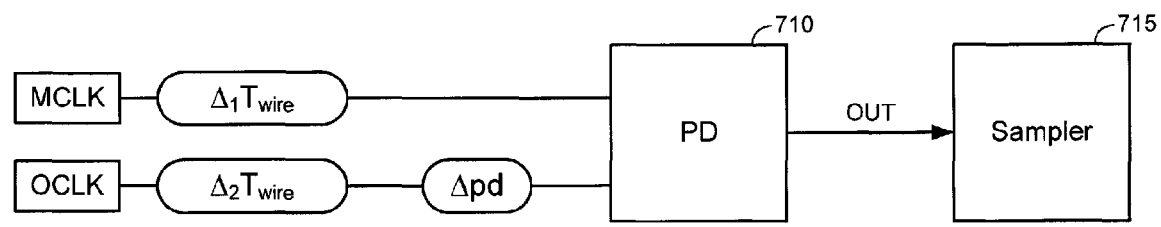
FIG. 7 illustrates a phase detector configuration.

FIG. 7 illustrates a phase detector configuration. As shown in FIG. 7, a phase detector 710 is configured to receive MCLK and OCLK, and to output an output signal OUT to a sampler 715. In an example the phase detector 710 of FIG. 7 may correspond to the phase detector 210 of FIG. 3. As discussed with respect to FIG. 1, MCLK is a memory clock signal for memory 105 and OCLK is an output register clock signal for output register 110. Unlike the description of FIG. 1, OCLK as used in embodiments of the invention denotes a reference clock signal between phase detector outputs (e.g., as in 600 and 605 of FIG. 6, and not necessarily as a register clock signal). The sampler 715 is configured to sample the output signal OUT. Additional functionality of the phase detector 710 and the sampler 715 is discussed below with respect to 600 of FIG. 6. The elements $\Delta_1 T_{wire}$, $\Delta_2 T_{wire}$, $\Delta pd$ are described in greater detail below with respect to Equation 2.

Referring to FIG. 6, in 600, the sampler 715 measures the skew between MCLK and OCLK. For example, the skew measurement of 600 may be performed by using the synchronization of MCLK and OCLK as discussed above. Thus, in 600, a clock generator (not shown) moves the rising edge of OCLK towards a rising edge of MCLK. Concurrently, the sampler 715 samples the output signal OUT. When the sampler 715 detects that the output signal OUT transitions from the first logic level (e.g., a higher logic level or logic "1") to the second logic level (e.g., a lower logic level or logic "0"), the sampler 715 records the clock skew. The transition of the output signal OUT signifies the synchronization of MCLK and OCLK at the phase detector input. The recorded clock skew may be represented as follows:

$$DT1 = T_{OCLK1} - T_{MCLK1} = \Delta_1 T_{wire} - \Delta_2 T_{wire} - \Delta pd \quad (2)$$

wherein DT1 or $(T_{OCLK1} - T_{MCLK1})$ denotes the clock skew between OCLK and MCLK, $\Delta_1$Twire is the parasitic timing delay of the memory clock signal MCLK from a chip pad (not shown) to the phase detector 710, $\Delta_2$Twire is the parasitic timing delay of the output clock signal OCLK from a chip pad (not shown) to the phase detector 710, and $\Delta pd$ is the phase detector resolution error of the phase detector 710.

Figure 8:
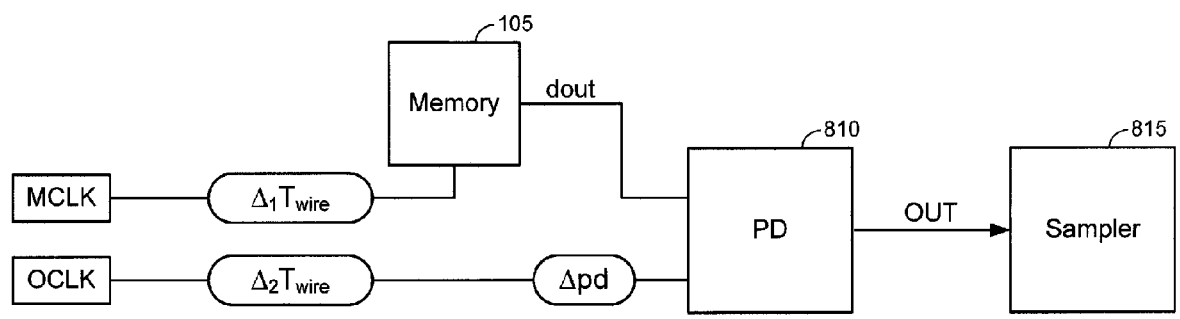
FIG. 8 illustrates another phase detector configuration.

FIG. 8 illustrates another phase detector configuration. The memory 105 is configured to receive MCLK and to perform a memory read operation. The memory 105 forwards a "delayed" version of MCLK, denoted as dout in FIG. 8, to a phase detector 810 once the memory operation completes (e.g., after a memory access time for the memory operation). The phase detector 810 is also configured to receive OCLK, similar to the phase detector 710 of FIG. 7, and to output an output signal OUT to a sampler 815. The sampler 815 is configured to sample the output signal OUT. Additional functionality of the memory 105, the phase detector 810 and the sampler 815 is discussed below with respect to 605 of FIG. 6.

Referring to FIG. 6, in 605, the sampler 815 measures the skew between OCLK and the "delayed" version of MCLK, or dout. In other words, the sampler 815 measures the skew between OLCK and MCLK (i.e, an "undelayed" version of MLC) plus an offset equal to the memory access time. Memory dout is configured to output a given bit sequence (e.g., 0101) to facilitate edge-detection. Next, the clock generator aligns the rising edges of MCLK and OCLK such that dout is rising behind the rising edge of OCLK. Next, the clock generator moves the rising edge of MCLK "forward" such that the rising edge of the delayed MCLK, or dout, approaches the rising edge of OCLK. Concurrently with the above steps, the sampler 815 samples the output signal OUT of the phase detector 810. When the rising edge of the delayed MCLK or dout reaches and/or passes the rising edge of OCLK, the output signal OUT transitions from the first logic level (e.g., a higher logic level or logic "1") to the second logic level (e.g., a lower logic level or logic "0"). At this point, the sampler 815 records the clock skew between MLCK and OCLK. The recorded clock skew may be represented as follows:

$$DT2 = T_{OCLK2} - T_{MCLK2} = \Delta_1 T_{wire} - \Delta_2 T_{wire} - \Delta pd + Tacc \quad (3)$$

wherein DT2 or $(T_{OCLK2} - T_{MCLK2})$ denotes the clock skew between OCLK and the delayed MCLK or dout, $\Delta_1 T_{wire}$ is the parasitic timing delay of the memory clock signal MCLK from a chip pad (not shown) to the memory 105, $\Delta_2$Twire is the parasitic timing delay of the output clock signal OCLK from a chip pad (not shown) to the phase detector 810, $\Delta pd$ is the phase detector resolution error of the phase detector 810, and Tacc is the memory access time of the memory operation performed by memory 105. In Equation 2, the parasitic timing delay is not illustrated between the memory 105 and the phase detector 810 because the parasitic timing delay is assumed to be relatively small (e.g., because the phase detector 810 is placed close to the memory output, which reduces the parasitic timing delay)

Returning to FIG. 6, once the sampler 715 determines the skew between OCLK and MCLK, 600, and the sampler 815 determines the skew between OCLK and dout, 605, the memory access time is computed in 615 (e.g., at a processing entity in communication with samplers 715 and 815, such as processing device 900 of FIG. 9, described below). The memory access time is computed by subtracting DT1 (see Equation 2) from DT2 (see Equation 3). For example, the samplers 715 and 815 may share DT1 and DT2 with a processing unit (not shown) that may compute the difference between DT1 and DT2 to determine the memory access time. As will be appreciated by one of ordinary skill in the art, subtracting DT1 from DT2 cancels out each parameter (i.e., $\Delta_1 T_{wire}$, $\Delta_2 T_{wire}$ and $\Delta pd$) other than the memory access time Tacc.

Figure 9:
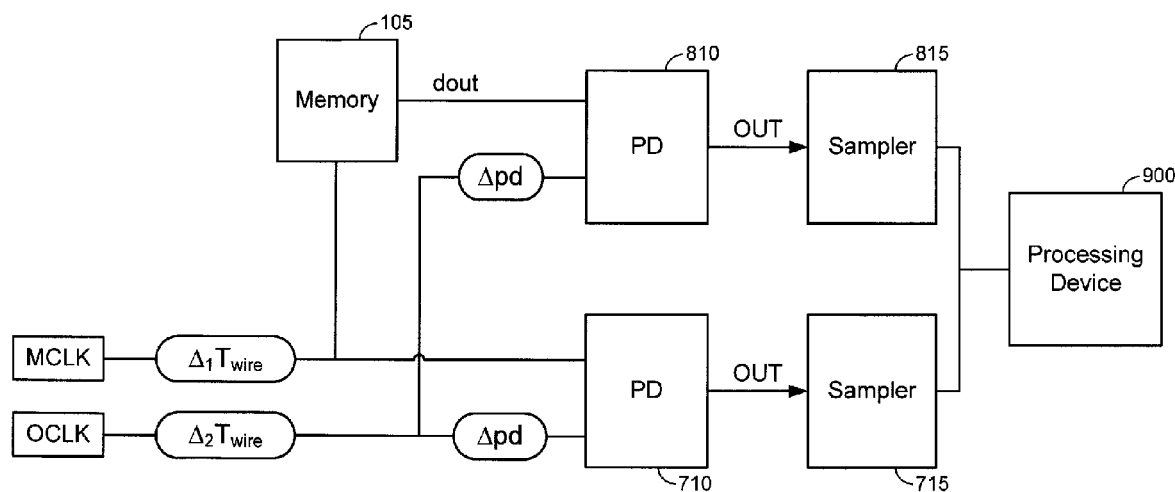
FIG. 9 illustrates a combined phase detector configuration for determining memory access time.

FIG. 9 illustrates a phase detector configuration according to another embodiment of the invention. In particular, FIG. 9 illustrates a combination of the elements present within FIGS. 7 and 8. The elements present within FIG. 9 will thereby not be discussed in further detail for the sake of brevity. As shown, OCLK may be coupled to both of phased detectors 710 and 810 from the same "source" or chip pad, and MLCK may be coupled to both of the memory 105 and the phase detector 710 from the same source or chip pad. Further, in FIG. 9, each of phase detectors 710 and 810 may be positioned relatively close to the memory 105 so as to reduce wire delays therein. If this is not possible, the phase detectors 710 and 810 may be positioned, in an example, to reduce wire delay effects. Further shown in FIG. 9 is a processing device 900, which is configured to perform 610 of FIG. 6 by determining the memory access time of the memory 105 based on the first and second phase skews measured or indicated by samplers 715 and 815.

Accordingly, in an embodiment of the invention, a memory clock signal for a memory and an output clock signal, which acts as a reference, may be routed to a first phase detector. The memory clock signal may be further routed to the memory, with the memory configured to output a delayed version of the memory clock signal to a second phase detector. The amount of delay incurred at the memory is substantially equal to a memory access time for the memory to perform a memory read operation. The output clock signal is also routed to the second phase detector. The first and second phase detectors then measure the skew between their respective signals, with the skew being a "snap-shot" of the offset between the respective signals based on a synchronization procedure at the respective phase detectors. The difference between the skews is then taken to determine the memory access time by cancelling out certain delays associated with the received signals that are common at both phase detectors. Thus, a more accurate memory access time for the memory may be determined as compared to the conventional art.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., access terminal). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of managing access of a memory, the method comprising:
   measuring a first phase skew between a first clock signal used by the memory and a second clock signal used to clock an output register, the output register configured to latch data read out from the memory;
   in parallel with measuring the first phase skew, measuring a second phase skew between a delayed version of the first clock signal output by the memory when the memory completes a given read operation and the second clock signal;
   determining a memory access time of the memory based on the first and second phase skews; and
   configuring the second clock signal to be offset from the first clock signal based on the determined memory access time, wherein the offset does not include common delays associated with the first and second phase skews.

2. The method of claim 1, wherein the first phase skew is measured by (i) inputting the first and second clock signals to a phase detector, (ii) sampling an output signal of the phase detector, (iii) adjusting one of the first and second clock signals at least until the sampling indicates that the output signal has transitioned to a different logic level and (iv) recording a phase offset between the first and second clock signals when the output signal transitions to the different logic level.

3. The method of claim 2, wherein the transitioning of the output signal to the different logic level indicates that the first and second clock signals are synchronized at the input of the phase detector.

4. The method of claim 1, wherein the second phase skew is measured by (i) inputting the delayed version of the first clock signal and the second clock signal to a phase detector, (ii) sampling an output signal of the phase detector, (iii) adjusting one of the delayed version of the first clock signal and the second clock signal at least until the sampling indicates that the output signal has transitioned to a different logic level and (iv) recording a phase offset between the delayed version of the first clock signal and the second clock signal when the output signal transitions to the different logic level.

5. The method of claim 4, wherein the transitioning of the output signal to the different logic level indicates that the first and second clock signals are synchronized at the input of the phase detector.

6. The method of claim 1, wherein the determining step subtracts the first phase skew from the second phase skew to calculate the memory access time.

7. The method of claim 1, wherein the delayed version of the first clock signal is delayed by a length of time substantially equal to the memory access time.

8. A system configured to manage access of a memory, the system comprising:
    means for measuring a first phase skew between a first clock signal used by the memory and a second clock signal used to clock an output register, the output register configured to latch data read from the memory;
    means for measuring a second phase skew between a delayed version of the first clock signal output by the memory when the memory completes a given read operation and the second clock signal, wherein the means for measuring the second phase skew is configured to be independent from and/or configured to operate in parallel with the means for measuring the first phase skew;
    means for determining a memory access time of the memory based on the first and second phase skews; and
    means for configuring the second clock signal to be offset from the first clock signal based on the determined memory access time, wherein the offset does not include common delays associated with the first and second phase skews.

9. The system of claim 8, wherein the means for measuring the first phase skew includes (i) means for inputting the first and second clock signals to a phase detector, (ii) means for sampling an output signal of the phase detector, (iii) means for adjusting one of the first and second clock signals at least until the sampling indicates that the output signal has transitioned to a different logic level and (iv) means for recording a phase offset between the first and second clock signals when the output signal transitions to the different logic level.

10. The system of claim 9, wherein the transitioning of the output signal to the different logic level indicates that the first and second clock signals are synchronized at the input of the phase detector.

11. The system of claim 8, wherein the means for measuring the second phase skew includes (i) means for inputting the delayed version of the first clock signal and the second clock signal to a phase detector, (ii) means for sampling an output signal of the phase detector, (iii) means for adjusting one of the delayed version of the first clock signal and the second clock signal at least until the sampling indicates that the output signal has transitioned to a different logic level and (iv) means for recording a phase offset between the delayed version of the first clock signal and the second clock signal when the output signal transitions to the different logic level.

12. The system of claim 11, wherein the transitioning of the output signal to the different logic level indicates that the first and second clock signals are synchronized at the input of the phase detector.

13. The system of claim 8, wherein the means for determining subtracts the first phase skew from the second phase skew to calculate the memory access time.

14. The system of claim 8, wherein the delayed version of the first clock signal is delayed by a length of time substantially equal to the memory access time.

15. A system configured to manage access of a memory, the system comprising:
    a first phase detector having first and second inputs, the first input connected to a memory clock signal over a first wired path having a first wire delay and the second input connected to a reference clock signal over a second wired path having a second wire delay;
    a second phase detector having third and fourth inputs, the third input connected to the memory clock signal over a third wired path having a third wire delay and the fourth input connected to the reference clock signal over a fourth wired path having a fourth wired delay, the third wired path including a memory portion that delays the third wired delay;
    a first sampler configured to measure a first phase skew between the memory clock signal over the first wired path and the reference clock signal over the second wired path by indicating when the first and second inputs of the first phase detector are synchronized;
    a second sampler configured to measure a second phase skew between the memory clock signal over the third wired path and the reference clock signal over the fourth wired path by indicating when the third and fourth inputs of the second phase detector are synchronized, wherein the second sampler is independent from and/or configured to operate in parallel with the first sampler;
    a processing device configured to determine a memory access time of the memory based on the first and second phase skews; and
    an output register clocked by the reference clock signal, wherein the reference clock is offset from the memory clock signal based on the determined memory access time, wherein the offset does not include common delays associated with the first and second phase skews.

16. The system of claim 15, wherein the first phase skew is measured by (i) inputting the memory and reference clock signals over the first and second wired paths to the first phase detector, (ii) sampling an output signal of the first phase detector at the first sampler, (iii) adjusting one of the memory and reference clock signals at least until the first sampler indicates that the output signal has transitioned to a different logic level and (iv) recording a phase offset between the memory and reference clock signals over the first and second wired paths when the output signal transitions to the different logic level.

17. The system of claim 16, wherein the transitioning of the output signal to the different logic level indicates that the memory and reference clock signals over the first and second wired paths are synchronized at the first and second inputs of the first phase detector.

18. The system of claim 15, wherein the second phase skew is measured by (i) inputting the memory and reference clock signals over the third and fourth wired paths to the second phase detector, (ii) sampling an output signal of the second phase detector at the second sampler, (iii) adjusting one of the memory and reference clock signals at least until the second sampler indicates that the output signal has transitioned to a different logic level and (iv) recording a phase offset between the memory and reference clock signals over the third and fourth wired paths when the output signal transitions to the different logic level.

19. The system of claim 18, wherein the transitioning of the output signal to the different logic level indicates that the memory and reference clock signals over the third and fourth wired paths are synchronized at the third and fourth inputs of the first phase detector.

20. The system of claim 15, wherein the processing device subtracts the first phase skew from the second phase skew to calculate the memory access time.

21. The system of claim 15, wherein the third wired delay is delayed from the first wired delay by a length of time substantially equal to the memory access time for a read operation of the memory.

22. A non-transitory computer-readable medium containing instructions stored thereon, which, when executed by an apparatus, cause the apparatus to perform operations for managing access of a memory, the instructions comprising:
program code to measure a first phase skew between a first clock signal used by the memory and a second clock signal used to clock an output register, the output register configured to latch data read out from the memory;
program code to measure a second phase skew between a delayed version of the first clock signal output by the memory when the memory completes a given read operation and the second clock signal, wherein the program code to measure the first phase skew is separate from and/or executed in parallel with the program code to measure the second phase skew;
program code to determine a memory access time of the memory based on the first and second phase skews; and
program code to configure the second clock signal to be offset from the first clock signal based on the determined memory access time, wherein the offset does not include common delays associated with the first and second phase skews.

* * * * *